United States Patent
Li et al.

(10) Patent No.: US 9,947,770 B2
(45) Date of Patent: Apr. 17, 2018

(54) SELF-ALIGNED TRENCH MOSFET AND METHOD OF MANUFACTURE

(75) Inventors: Jian Li, Palo Alto, CA (US); Kuo-In Chen, Los Altos, CA (US); Kyle Terril, Santa Clara, CA (US)

(73) Assignee: Vishay-Siliconix, Santa Clara, CA (US)

( * ) Notice: Subject to any disclaimer, the term of this patent is extended or adjusted under 35 U.S.C. 154(b) by 230 days.

(21) Appl. No.: 12/015,723

(22) Filed: Jan. 17, 2008

(65) Prior Publication Data

US 2008/0246081 A1 Oct. 9, 2008

Related U.S. Application Data

(60) Provisional application No. 60/921,792, filed on Apr. 3, 2007.

(51) Int. Cl.
*H01L 29/66* (2006.01)
*H01L 29/10* (2006.01)
(Continued)

(52) U.S. Cl.
CPC .... *H01L 29/66734* (2013.01); *H01L 29/1095* (2013.01); *H01L 29/41766* (2013.01);
(Continued)

(58) Field of Classification Search
USPC .......... 257/331–333, 341, 342, 330, 29.121, 257/E29.146, E29.257
See application file for complete search history.

(56) References Cited

U.S. PATENT DOCUMENTS

| 3,906,540 A | 9/1975 | Hollins |
| 4,641,174 A | 2/1987 | Baliga |

(Continued)

FOREIGN PATENT DOCUMENTS

| CN | 101180737 | 5/2008 |
| DE | 102004036330 | 3/2005 |

(Continued)

OTHER PUBLICATIONS

Masakatsu Hoshi et al., "A DMOSFET Having a Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

(Continued)

*Primary Examiner* — Laura Menz
*Assistant Examiner* — Candice Y Chan

(57) ABSTRACT

A trench metal-oxide-semiconductor field effect transistor (MOSFET), in accordance with one embodiment, includes a drain region, a plurality of gate regions disposed above the drain region, a plurality of gate insulator regions each disposed about a periphery of a respective one of the plurality of gate regions, a plurality of source regions disposed in recessed mesas between the plurality of gate insulator regions, a plurality of body regions disposed in recessed mesas between the plurality of gate insulator regions and between the plurality of source regions and the drain region. The MOSFET also includes a plurality of body contact regions disposed in the each body region adjacent the plurality of source regions, a plurality of source/body contact spacers disposed between the plurality of gate insulator regions above the recessed mesas, a source/body contact disposed above the source/body contact spacers, and a plurality of source/body contact plugs disposed between the source/body contact spacers and coupling the source/body contact to the plurality of body contact regions and the plurality of source regions.

7 Claims, 13 Drawing Sheets

(51) Int. Cl.
*H01L 29/417* (2006.01)
*H01L 29/78* (2006.01)
*H01L 29/45* (2006.01)
*H01L 29/49* (2006.01)

(52) U.S. Cl.
CPC .. *H01L 29/66719* (2013.01); *H01L 29/66727* (2013.01); *H01L 29/7813* (2013.01); *H01L 29/456* (2013.01); *H01L 29/4925* (2013.01); *H01L 29/4933* (2013.01)

(56) References Cited

U.S. PATENT DOCUMENTS

| | | | |
|---|---|---|---|
| 4,672,407 | A | 6/1987 | Nakagawa et al. |
| 4,782,372 | A | 11/1988 | Nakagawa et al. |
| 4,799,095 | A | 1/1989 | Baliga |
| 4,823,172 | A | 4/1989 | Mihara |
| 4,827,321 | A | 5/1989 | Baliga |
| 4,857,986 | A | 8/1989 | Kinugawa |
| 4,893,160 | A | 1/1990 | Blanchard |
| 4,928,155 | A | 5/1990 | Nakagawa et al. |
| 4,939,557 | A | 7/1990 | Pao et al. |
| 4,967,243 | A | 10/1990 | Baliga et al. |
| 4,969,027 | A | 11/1990 | Baliga et al. |
| 5,021,840 | A | 6/1991 | Morris |
| 5,055,896 | A | 10/1991 | Williams et al. |
| 5,072,266 | A | 12/1991 | Bulucea et al. |
| 5,111,253 | A | 5/1992 | Korman et al. |
| 5,168,331 | A | 12/1992 | Yilmaz |
| 5,191,395 | A | 3/1993 | Nishimura |
| 5,221,850 | A | 6/1993 | Sakurai |
| 5,233,215 | A | 8/1993 | Baliga |
| 5,245,106 | A | 9/1993 | Cameron et al. |
| 5,366,914 | A | 11/1994 | Takahashi et al. |
| 5,378,655 | A | 1/1995 | Hutchings et al. |
| 5,387,528 | A | 2/1995 | Hutchings et al. |
| 5,430,315 | A * | 7/1995 | Rumennik ............... 257/331 |
| 5,525,821 | A | 6/1996 | Harada et al. |
| 5,527,720 | A | 6/1996 | Goodyear et al. |
| 5,567,634 | A | 10/1996 | Hebert et al. |
| 5,578,508 | A | 11/1996 | Baba et al. |
| 5,602,424 | A | 2/1997 | Tsubouchi et al. |
| 5,621,234 | A | 4/1997 | Kato |
| 5,648,283 | A | 7/1997 | Tsang et al. |
| 5,689,128 | A | 11/1997 | Hshieh |
| 5,696,396 | A | 12/1997 | Tokura et al. |
| 5,770,878 | A | 6/1998 | Beasom |
| 5,808,340 | A * | 9/1998 | Wollesen et al. ............ 257/330 |
| 5,814,858 | A | 9/1998 | Williams |
| 5,877,538 | A | 3/1999 | Williams |
| 5,965,904 | A | 10/1999 | Ohtani et al. |
| 5,998,836 | A | 12/1999 | Williams |
| 5,998,837 | A | 12/1999 | Williams |
| 6,049,108 | A | 4/2000 | Williams et al. |
| 6,096,584 | A | 8/2000 | Ellis-Monaghan et al. |
| 6,140,678 | A | 10/2000 | Grabowski et al. |
| 6,153,896 | A | 11/2000 | Omura et al. |
| 6,168,996 | B1 | 1/2001 | Numazawa et al. |
| 6,172,398 | B1 | 1/2001 | Hshieh |
| 6,180,966 | B1 | 1/2001 | Kohno et al. |
| 6,204,533 | B1 | 3/2001 | Williams et al. |
| 6,211,018 | B1 | 4/2001 | Nam et al. |
| 6,238,981 | B1 | 5/2001 | Grebs |
| 6,245,615 | B1 | 6/2001 | Noble et al. |
| 6,268,242 | B1 | 7/2001 | Williams et al. |
| 6,277,695 | B1 | 8/2001 | Williams et al. |
| 6,285,060 | B1 | 9/2001 | Korec et al. |
| 6,323,518 | B1 | 11/2001 | Sakamoto et al. |
| 6,348,712 | B1 | 2/2002 | Korec et al. |
| 6,351,009 | B1 | 2/2002 | Kocon et al. |
| 6,359,308 | B1 | 3/2002 | Hijzen et al. |
| 6,391,721 | B2 | 5/2002 | Nakagawa |
| 6,413,822 | B2 | 7/2002 | Williams et al. |
| 6,483,171 | B1 | 11/2002 | Forbes et al. |
| 6,489,204 | B1 | 12/2002 | Tsui |
| 6,495,883 | B2 | 12/2002 | Shibata et al. |
| 6,498,071 | B2 | 12/2002 | Hijzen et al. |
| 6,580,123 | B2 | 6/2003 | Thapar |
| 6,580,154 | B2 | 6/2003 | Noble et al. |
| 6,642,109 | B2 | 11/2003 | Lee et al. |
| 6,661,054 | B1 | 12/2003 | Nakamura |
| 6,700,158 | B1 | 3/2004 | Cao et al. |
| 6,710,403 | B2 | 3/2004 | Sapp |
| 6,717,210 | B2 | 4/2004 | Takano et al. |
| 6,756,274 | B2 | 6/2004 | Williams et al. |
| 6,764,889 | B2 | 7/2004 | Baliga |
| 6,770,539 | B2 | 8/2004 | Sumida |
| 6,825,105 | B2 | 11/2004 | Grover et al. |
| 6,861,701 | B2 | 3/2005 | Williams et al. |
| 6,903,393 | B2 | 6/2005 | Ohmi et al. |
| 6,919,610 | B2 | 7/2005 | Saitoh et al. |
| 6,927,455 | B2 | 8/2005 | Narazaki |
| 6,960,821 | B2 | 11/2005 | Noble et al. |
| 6,987,305 | B2 | 1/2006 | He et al. |
| 7,224,022 | B2 | 5/2007 | Tokano et al. |
| 7,361,952 | B2 | 4/2008 | Miura et al. |
| 7,375,029 | B2 | 5/2008 | Poelzl |
| 7,397,083 | B2 | 7/2008 | Amali et al. |
| 7,449,354 | B2 | 11/2008 | Marchant et al. |
| 7,521,306 | B2 * | 4/2009 | Kubo et al. .................... 438/197 |
| 7,541,642 | B2 * | 6/2009 | Kawamura et al. .......... 257/331 |
| 7,544,568 | B2 | 6/2009 | Matsuura et al. |
| 7,652,325 | B2 | 1/2010 | Siemieniec et al. |
| 7,663,195 | B2 | 2/2010 | Ohmi et al. |
| RE41,509 | E | 8/2010 | Kinzer et al. |
| 7,910,440 | B2 | 3/2011 | Ohta et al. |
| 7,910,486 | B2 | 3/2011 | Yilmaz et al. |
| 7,964,913 | B2 | 6/2011 | Darwish |
| 8,080,459 | B2 | 12/2011 | Xu |
| 8,367,500 | B1 | 2/2013 | Xu et al. |
| 8,629,019 | B2 | 1/2014 | Xu et al. |
| 2001/0026006 | A1 | 10/2001 | Noble et al. |
| 2001/0026989 | A1 | 10/2001 | Thapar |
| 2002/0036319 | A1 | 3/2002 | Baliga |
| 2002/0038887 | A1 | 4/2002 | Ninomiya et al. |
| 2002/0050847 | A1 | 5/2002 | Taniguchi et al. |
| 2002/0074585 | A1 | 6/2002 | Tsang et al. |
| 2002/0123196 | A1 | 9/2002 | Chang et al. |
| 2002/0130359 | A1 | 9/2002 | Okumura et al. |
| 2003/0030092 | A1 | 2/2003 | Darwish et al. |
| 2003/0201483 | A1 | 10/2003 | Sumida |
| 2004/0016959 | A1 | 1/2004 | Yamaguchi et al. |
| 2004/0021174 | A1 | 2/2004 | Kobayashi |
| 2004/0155287 | A1 | 8/2004 | Omura et al. |
| 2004/0161886 | A1 | 8/2004 | Forbes et al. |
| 2004/0173844 | A1 | 9/2004 | Williams et al. |
| 2005/0001268 | A1 | 1/2005 | Baliga |
| 2005/0026369 | A1 | 2/2005 | Noble et al. |
| 2005/0029585 | A1 | 2/2005 | He et al. |
| 2005/0079678 | A1 | 4/2005 | Verma et al. |
| 2005/0167695 | A1 | 8/2005 | Yilmaz |
| 2005/0167698 | A1 | 8/2005 | Hisaka |
| 2005/0184336 | A1 | 8/2005 | Takahaski |
| 2005/0266642 | A1 | 12/2005 | Kubo et al. |
| 2006/0014349 | A1 | 1/2006 | Williams et al. |
| 2006/0108635 | A1 | 5/2006 | Bhalla et al. |
| 2006/0113577 | A1 | 6/2006 | Ohtani |
| 2006/0113588 | A1 | 6/2006 | Wu |
| 2006/0226494 | A1 | 10/2006 | Hshieh |
| 2006/0267090 | A1 | 11/2006 | Sapp et al. |
| 2006/0273383 | A1 | 12/2006 | Hshieh |
| 2006/0285368 | A1 | 12/2006 | Schlecht |
| 2007/0007589 | A1 | 1/2007 | Nakagawa |
| 2007/0013000 | A1 | 1/2007 | Shiraishi |
| 2007/0023828 | A1 | 2/2007 | Kawamura et al. |
| 2007/0138546 | A1 | 6/2007 | Kawamura et al. |
| 2007/0155104 | A1 | 7/2007 | Marchant et al. |
| 2007/0228496 | A1 | 10/2007 | Rochefort et al. |
| 2007/0249142 | A1 | 10/2007 | Hisanaga |
| 2008/0099344 | A9 | 5/2008 | Basol et al. |
| 2008/0135931 | A1 | 6/2008 | Challa et al. |
| 2008/0164515 | A1 | 7/2008 | Li |
| 2008/0164517 | A1 | 7/2008 | Ohta et al. |
| 2008/0173969 | A1 | 7/2008 | Hebert et al. |

(56) References Cited

U.S. PATENT DOCUMENTS

| | | |
|---|---|---|
| 2008/0185640 A1 | 8/2008 | Nakagawa |
| 2008/0246081 A1 | 10/2008 | Li et al. |
| 2009/0140327 A1 | 6/2009 | Hirao et al. |
| 2009/0159963 A1 | 6/2009 | Yamaguchi et al. |
| 2009/0166740 A1 | 7/2009 | Bhalla et al. |
| 2010/0055892 A1 | 3/2010 | Poelzl |
| 2010/0059797 A1 | 3/2010 | Ngai et al. |
| 2010/0078718 A1 | 4/2010 | Blank et al. |
| 2010/0181606 A1 | 7/2010 | Takaishi |
| 2011/0049614 A1 | 3/2011 | Gao et al. |
| 2011/0053326 A1 | 3/2011 | Gao et al. |
| 2011/0089486 A1 | 4/2011 | Xu et al. |
| 2012/0187474 A1 | 7/2012 | Rexer et al. |
| 2012/0313161 A1 | 12/2012 | Grivna et al. |
| 2012/0326229 A1 | 12/2012 | Poelzl et al. |
| 2014/0206165 A1 | 7/2014 | Li et al. |
| 2015/0108568 A1 | 4/2015 | Terrill et al. |

FOREIGN PATENT DOCUMENTS

| | | |
|---|---|---|
| DE | 112005003584 | 4/2008 |
| EP | 0 133 642 A1 | 3/1985 |
| EP | 0354449 | 2/1990 |
| EP | 0 438 700 A1 | 7/1991 |
| EP | 0 583 022 A2 | 2/1994 |
| EP | 0 583 028 A1 | 2/1994 |
| EP | 0620588 | 10/1994 |
| EP | 0 628 337 | 12/1994 |
| EP | 0 746 030 A2 | 12/1996 |
| EP | 1 033 759 A2 | 9/2000 |
| EP | 1 186 023 | 3/2002 |
| EP | 1351313 | 10/2003 |
| EP | 1376674 | 1/2004 |
| EP | 1403914 | 3/2004 |
| GB | 2 269 050 A | 1/1994 |
| JP | 62-298152 | 12/1987 |
| JP | H03-173180 | 7/1991 |
| JP | H05-315620 | 11/1993 |
| JP | H06350090 A | 12/1994 |
| JP | H09-129877 | 5/1997 |
| JP | H09-260645 | 10/1997 |
| JP | H10-032331 | 2/1998 |
| JP | H10-214809 | 8/1998 |
| JP | 2000-091344 | 3/2000 |
| JP | 2000-332246 | 11/2000 |
| JP | 0065646 | 11/2000 |
| JP | 2001-016080 | 1/2001 |
| JP | 2002-016080 | 1/2002 |
| JP | 2001016080 | 1/2002 |
| JP | 2002110978 | 4/2002 |
| JP | 2002-134705 | 5/2002 |
| JP | 2002-190593 | 7/2002 |
| JP | 2002-222950 | 8/2002 |
| JP | 2002-246596 | 8/2002 |
| JP | 2002-368221 | 12/2002 |
| JP | 2002-373988 | 12/2002 |
| JP | 2003030396 | 1/2003 |
| JP | 2003-515954 | 5/2003 |
| JP | 2003-324196 | 11/2003 |
| JP | 2004/134793 | 4/2004 |
| JP | 2004-522319 | 7/2004 |
| JP | 2005-142240 | 6/2005 |
| JP | 2005142240 | 6/2005 |
| JP | 2005-524970 | 8/2005 |
| JP | 2005-268679 | 9/2005 |
| JP | 2005268679 | 9/2005 |
| JP | 2006-339558 | 12/2006 |
| JP | 2007027561 | 2/2007 |
| JP | 2007-158275 | 6/2007 |
| JP | 2007-189192 | 7/2007 |
| JP | 2008-042056 | 2/2008 |
| JP | 2008042056 | 2/2008 |
| JP | 2008-511982 | 4/2008 |
| JP | 2008-171887 | 7/2008 |
| JP | 2009-004411 | 1/2009 |
| JP | 2009004411 | 1/2009 |
| JP | 2009-043966 | 2/2009 |
| JP | 2009-522807 | 6/2009 |
| JP | 2009522807 | 6/2009 |
| KR | 10-0714198 | 5/2007 |
| TW | 490853 B | 6/2002 |
| TW | 200507237 | 2/2005 |
| TW | I302028 B | 10/2008 |
| WO | 0141206 | 6/2001 |
| WO | 0199177 | 12/2001 |
| WO | 03010812 | 2/2003 |
| WO | 20040105116 | 2/2004 |
| WO | 20060058210 | 1/2006 |
| WO | 2006025035 | 3/2006 |
| WO | 2006126998 | 11/2006 |
| WO | 2007002857 | 1/2007 |
| WO | WO2007002857 | 1/2007 |
| WO | 2008156071 A1 | 12/2008 |

OTHER PUBLICATIONS

"Effects on Selecting Channel Direction in Improving Performance of Sub-100 nm MOSFETs Fabricated on (110) Surface Si Substrate" Japanese Journal of Applied Physics, Part 1, vol. 43, No. 4B, Apr. 2004 pp. 1723-1728 (Nakamura et al.), XP00122768.

Hattori, et al. Design of a 200V Super Junction Mosfet With N-Buffer Regions and Its Fabrication by Trench Filling; Proceedings of 2004 International Symposium on Power Semiconductor Devices & ICS, Kitakyusus; 2004.

Y. C. Pao et al., "(110)-Oriented GaAs MESFET's", IEEE Electron Device Letters, vol. 9, No. 3, pp. 119-121, Mar. 1988.

L. Parechanian-Allen et al., "Device Quality Growth and Characterization of(110) GaAs Grown by Molecular Beam Epitaxy", submitted to Applied Physics Letters, Nov. 1986, Lawrence Berkeley Laboratory University of California, Berkeley, California, LBL-22564.

L. Parechanian-Allen et al., "Surface Faceting of (110) GaAs: Analysis and Elimination", presented at the Material Research Society Fall Conference, Session I, Boston, MA, Dec. 1, 1986, Lawrence Berkeley Laboratory University of California, Berkeley, California, LBL-22577.

* cited by examiner

SELF-ALIGNED TRENCH MOSFET AND METHOD OF MANUFACTURE

CROSS-REFERENCE TO RELATED APPLICATIONS

This application claims the benefit of U.S. Provisional Application No. 60/921,792 filed Apr. 3, 2007.

BACKGROUND OF THE INVENTION

To reduce the drain-to-source on-resistance (Rdson) in power metal-oxide-semiconductor field effect transistors (MOSFET), numerous novel structures have been proposed and implemented. In trench based MOSFETs, shrinking the lateral pitch to increase cell density has been used to effectively reduce Rdson of the multi-cell MOSFETs. However, the ability to shrink the pitch below 1 micrometer (um) has been limited by source contact alignment errors, even when deep-ultraviolet (DUV) photolithography is used. Accordingly, there is a continued need to further reduce the Rdson of MOSFETs and improved techniques for fabricating such MOSFETs.

SUMMARY OF THE INVENTION

Embodiments of the present technology provide an improved trench metal-oxide-semiconductor field effect transistor (MOSFET). More specifically, embodiments of the present invention provide a trench MOSFET including a drain region, a plurality of gate regions disposed above the drain region, a plurality of gate insulator regions disposed about a periphery of a respective one of the plurality of gate regions, a field insulator region disposed above the gate region, a plurality of source regions disposed along the surface of the body region proximate a periphery of the gate insulator region. A plurality of source/body contact spacers are disposed in recessed mesas above the plurality of source regions and between the gate insulator regions. The recessed mesas are formed by a first silicon etch self-aligned to the field insulator region. A plurality of source/body contact plugs are disposed through the source/body contact spacers and the plurality of source regions between the gate insulator regions. A plurality of source/body contact implants are disposed in the body region proximate the source/body contacts. The source/body contacts implants are formed by an implant self-aligned to the plurality of source body contact spacers Embodiments of the present technology also provide a method of fabricating a trench MOSFET that includes depositing a first semiconductor layer upon a semiconductor substrate, wherein the first semiconductor layer and the semiconductor substrate are doped with a first type of impurity. A first portion of the first semiconductor layer is doped with a second type of impurity. A plurality of trenches are etched in the first semiconductor layer. A first dielectric layer is formed on the wall of the plurality of trenches. A second semiconductor layer is deposited in the plurality of trenches. A second dielectric layer is formed over the second semiconductor layer in the plurality of trenches. Recessed mesas are etched in the first semiconductor layer and are self-aligned by the second dielectric layer in the plurality of trenches. A second portion of the first semiconductor layer proximate the recessed mesas is doped with a second type of impurity. A plurality of source/body contact spacers are formed in the recessed mesas self-aligned by the second dielectric layer in the trenches. A plurality of source/body contact trenches are etched between the source/body contact spacers. The source body contact trenches extend through the second portion of the first semiconductor layer. A third portion of the first semiconductor layer proximate the source/body contact trenches is doped with the first type of impurity self-aligned by the source/body contact spacers. A first metal layer is deposited in the source/body contact trenches.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Figure 1:
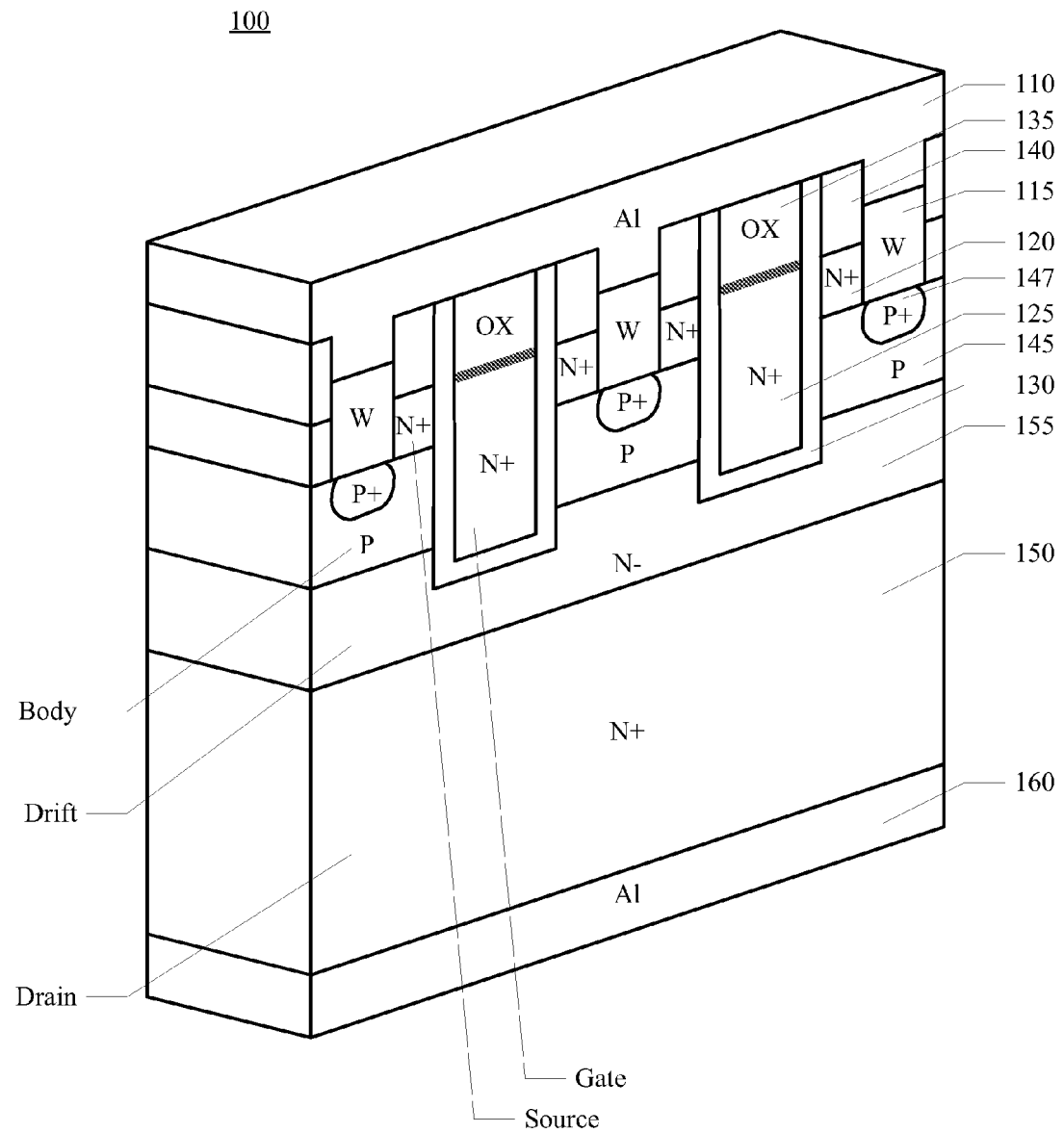
FIG. 1 shows a cross sectional perspective view of a trench MOSFET, in accordance with one embodiment of the present technology.

Referring to FIG. 1, a cross sectional perspective view of a trench metal-oxide-semiconductor field effect transistor (MOSFET) 100, in accordance with one embodiment of the present technology, is shown. The trench MOSFET 100 comprises a source/body contact 110, a plurality of source/body contact plugs 115, a plurality of source regions 120, a plurality of gate regions 125, a plurality of gate insulator regions 130, a plurality of field dielectric regions 135, a plurality of source/body contact spacers 140, a plurality of body regions 145, a plurality of body contact regions 147, a drain region 150, 155 and drain contact 160. The drain region 150, 155 may optionally include a first drain portion 150 and a second drain portion 155, which are conventionally referred to as a drain region and a drift region respectively.

The body regions 145 are disposed above the drain region 150, 155. The source regions 120, gate regions 125 and the gate insulator regions 130 are disposed within the body regions 145. The gate regions 125 and the gate insulator regions 130 may be formed as parallel-elongated structures in a striped cell implementation. The gate insulator region 130 surrounds the gate regions 125. The field dielectric regions 135 are disposed above the gate regions 125. Thus, the gate regions 125 are electrically isolated from the surrounding regions by the gate insulator regions 130 and field dielectric regions 135. The gate regions 125 are coupled to form a common gate of the device 100. The source regions 120 are formed as parallel-elongated structures along the periphery of the gate insulator regions 130. The source/body contact 110 is coupled to the source regions 120 and the body regions 145 by the source/body contact plugs 125.

In another implementation, the gate region 125 may include a first portion formed as a first plurality of substantially parallel elongated structures and a second portion formed as a second plurality of substantially elongated structures that are substantially perpendicular to the first plurality of substantially parallel elongated structures. The gate insulator region 130 is disposed about a periphery of the gate region 125. Accordingly, the gate insulator region 130 is also formed as a first plurality of substantially parallel elongated structures and a second portion formed as a second plurality of substantially elongated structures that are substantially perpendicular to the first plurality of substantially parallel elongated structures.

The plurality of source/body contact spacers 140 are disposed in recessed mesas above the plurality of source regions 120 and between the gate insulator regions 125. The recessed mesas are formed be a first silicon etch that is self-aligned to the field insulator region 135 and gate oxide region 130. The plurality of source/body contact plugs 115 are disposed through the source/body contact spacers 140 and the plurality of source regions 120. The plurality of body contact regions 147 are disposed in the body regions 145 proximate the source/body contact plugs 115. The body contact regions 147 are formed by an implant self-aligned by the plurality of source body contact spacers 140.

In an exemplary implementation, the source regions 120 and the drain region 150 may be heavily n-doped (N+) semiconductor, such as silicon doped with phosphorous or arsenic. The body regions 145 may be p-doped (P) semiconductor, such as silicon doped with boron. The gate region 125 may be heavily n-doped (N+) semiconductor, such as polysilicon doped with phosphorous. The gate insulator regions 130 may be an insulator, such as silicon dioxide. The source contact 110 and drain contact may be copper (Cu), aluminum (Al), a multilayer metal or the like.

When the potential of the gate regions 125, with respect to the source regions 120, is increased above the threshold voltage of the device 100, a conducting channel is induced in the body region 145 along the periphery of the gate insulator regions 120. The trench MOSFET 100 will then conduct current between the drain region 150 and the source regions 120. Accordingly, the device will be in its on state.

When the potential of the gate regions 125 is reduced below the threshold voltage, the channel is no longer induced. As a result, a voltage potential applied between the drain region 150 and the source regions 120 will not cause current to flow there between. Accordingly, the device 100 will be in its off state and the junction formed by the body region 145 and the drain region 150 supports the voltage applied across the source and drain.

If the drain region 150, 155 comprises a second drain portion 155 disposed above a first drain portion 150, the second portion of the drain region 155 may be lightly n-doped (N−) semiconductor, such as silicon doped with phosphorous or arsenic, and the first portion of the drain region 150 may be heavily n-doped (N+) semiconductor, such as silicon doped with phosphorous or arsenic. The lightly n-doped (N−) second portion of the drain region 155 results in a depletion region that extends into both the body regions 145 and the second portion of the drain region 150, thereby reducing the punch through effect. Accordingly, the lightly n-doped (N−) second portion of the drain region 150 acts to increase the breakdown voltage of the striped trench MOSFET 100.

The channel width of the trench MOSFET 100 is a function of the lateral length of the plurality of the source regions 120. The channel width increases as the cell density is increased. The channel length of the trench MOSFET is a function of the vertical depth of the body region 145. Thus, the channel width to length ratio increases as the cell density of the trench MOSFET 100 is increased, which results in a decreased drain-to-source on-resistance (Rdson) during the on state of the device. Therefore, the trench MOSFET may advantageously be utilized for power MOSFET applications, such as switching elements in a pulse width modulation (PWM) voltage regulator.

Figure 2A:
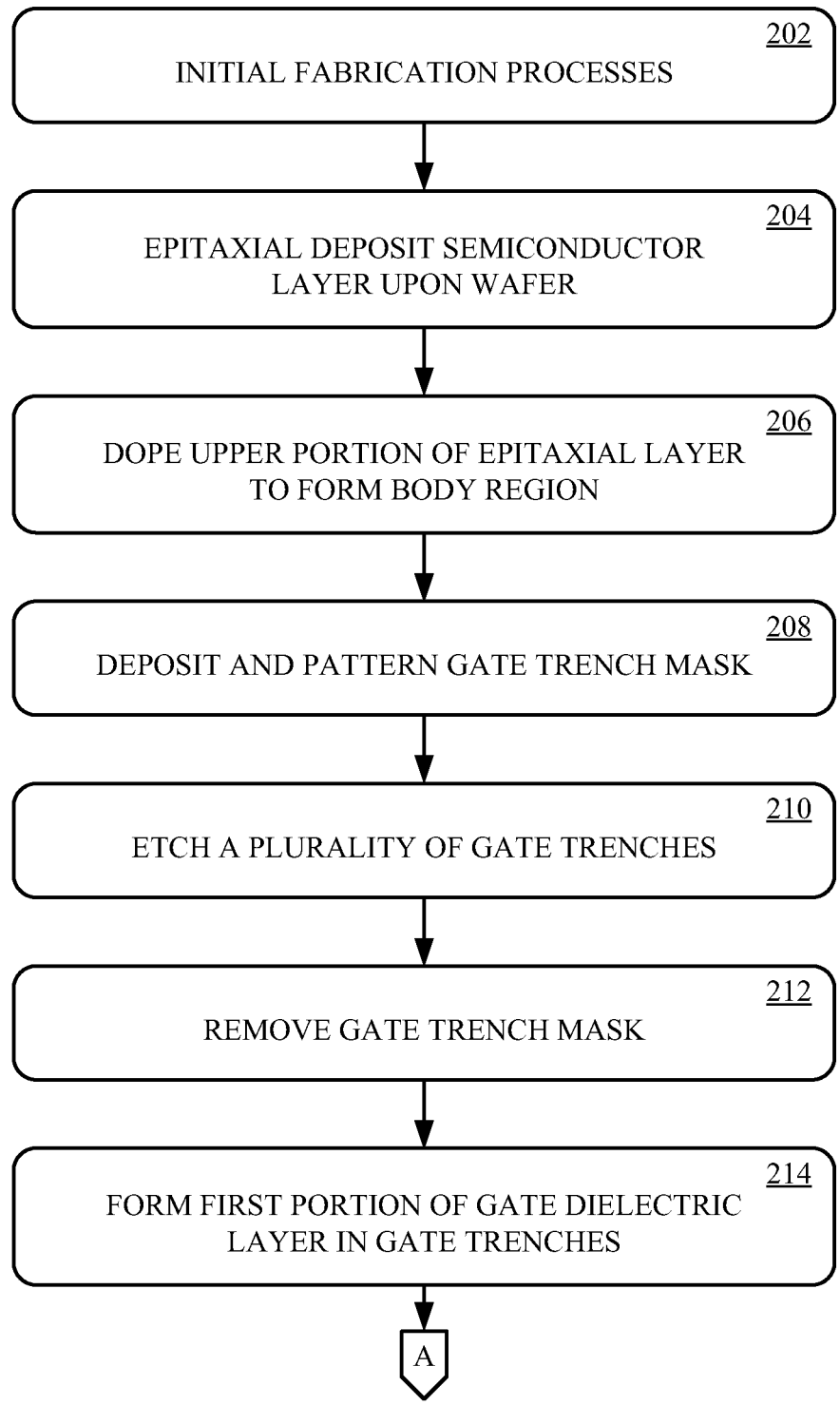
FIGS. 2A-2D show a flow diagram of a method of fabricating a trench MOSFET, in accordance with one embodiment of the present technology.
Figure 2B:
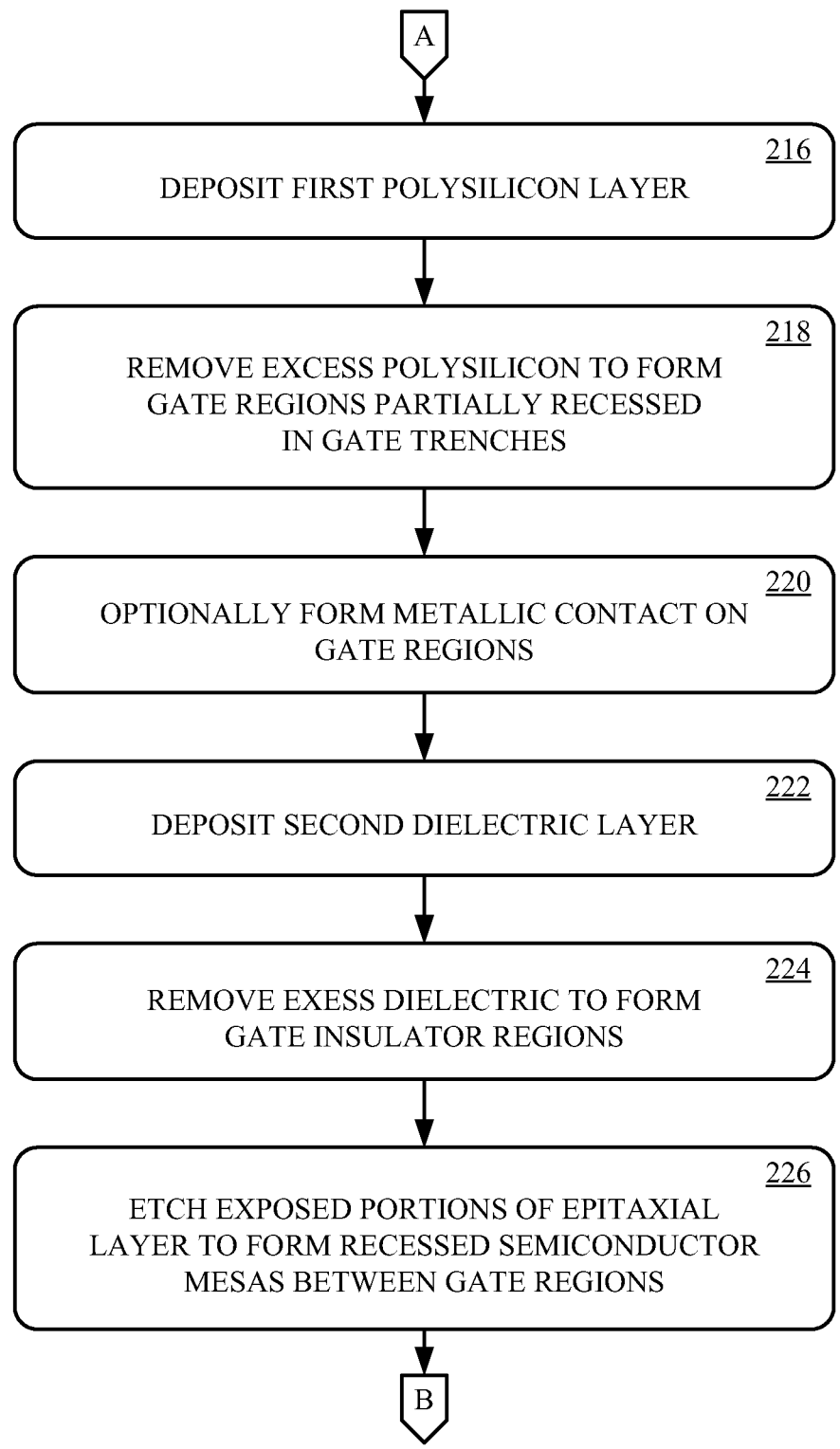
Figure 2C:
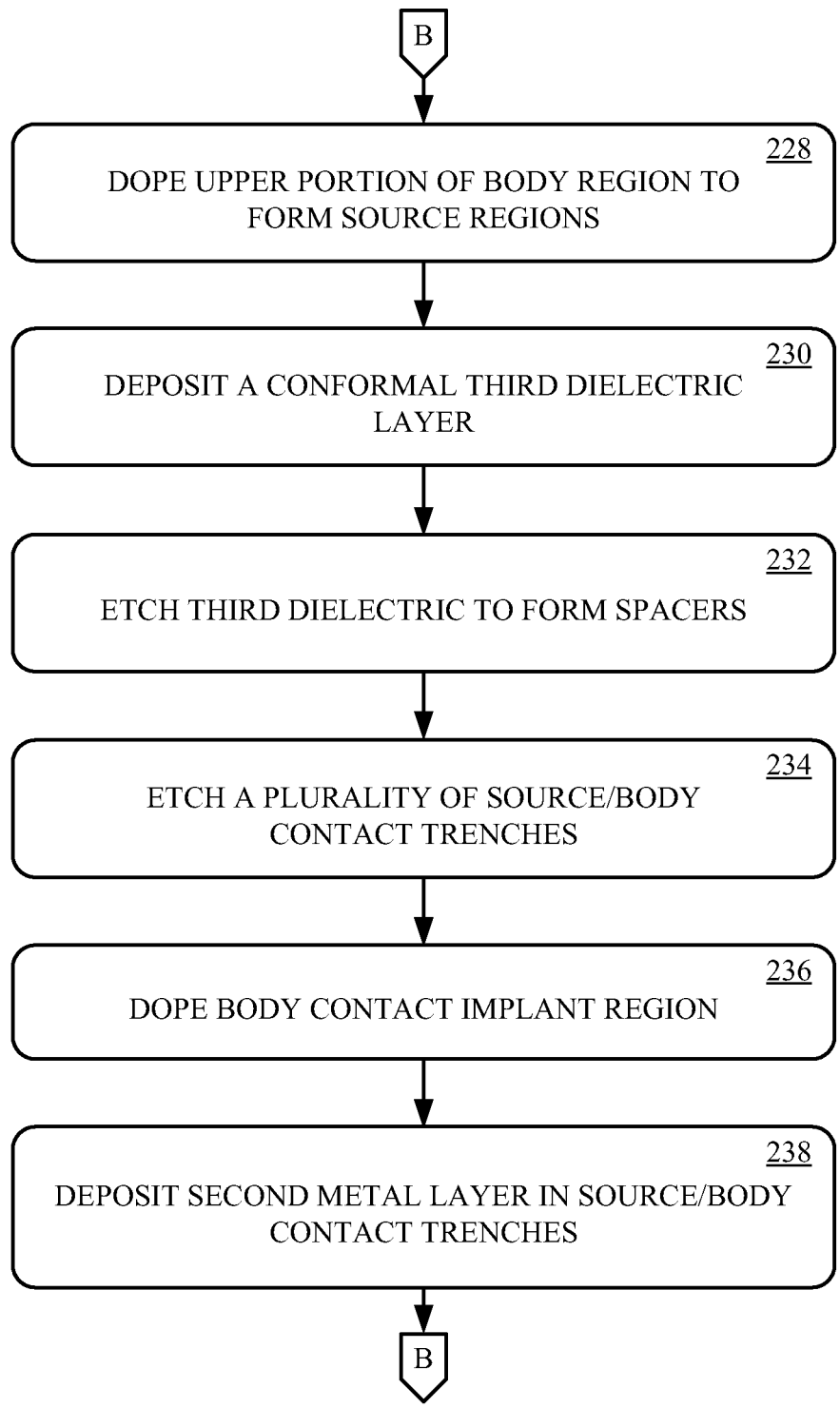
Figure 2D:
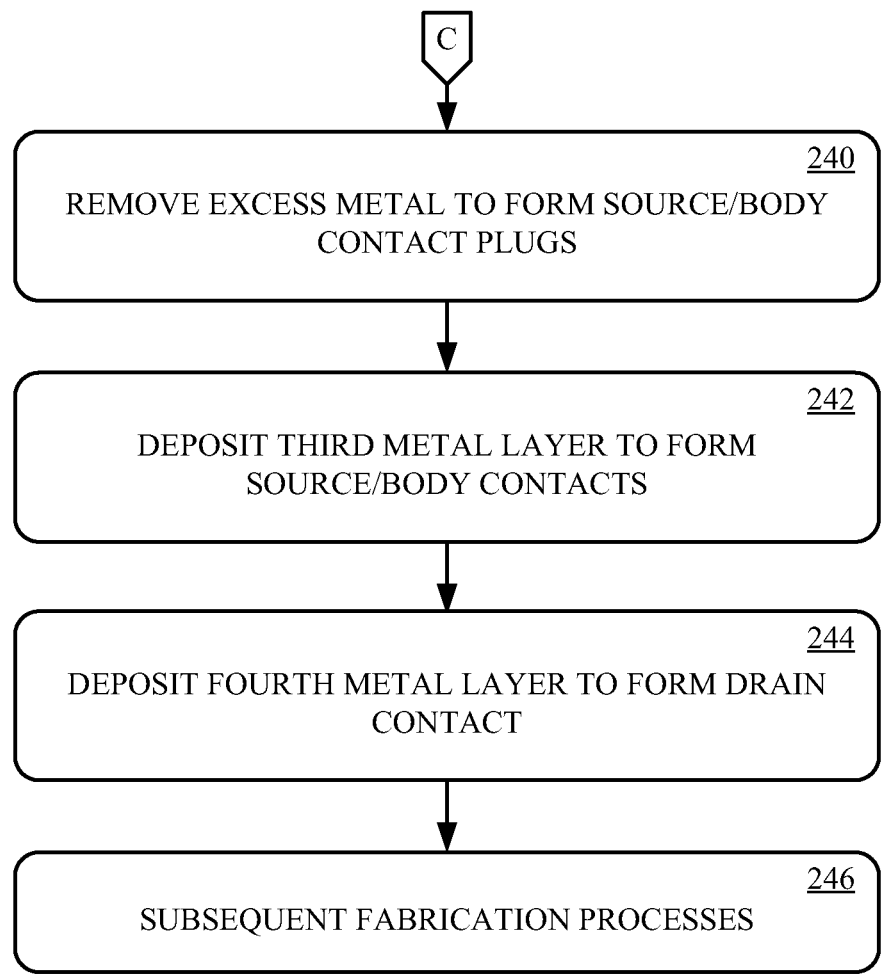
Figure 3A:
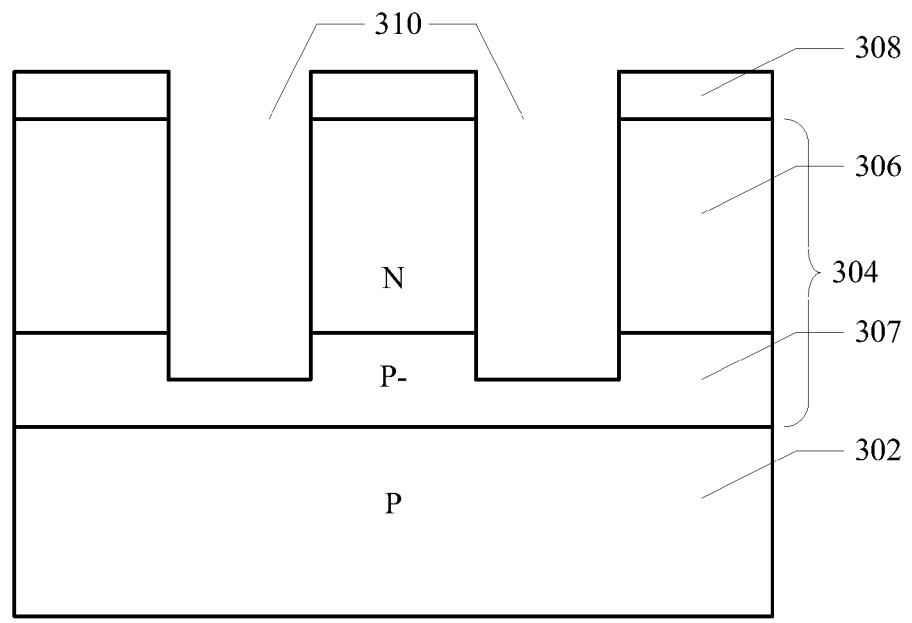
FIGS. 3A-3M show a cross-sectional view of phases of fabricating a trench MOSFET, in accordance with one embodiment of the present technology.

Referring now to FIGS. 2A-2D, a flow diagram of a method of fabricating a trench MOSFET, in accordance with one embodiment of the present technology, is shown. The method of fabricating the trench MOSFET is illustrated in FIGS. 3A-3M. As depicted in FIGS. 2A and 3A, the process begins, at 202, with various initial processes upon a substrate 302, such as cleaning, depositing, doping, etching and/or the like. In one implementation, the substrate 302 comprises silicon heavily doped with a first type of impurity (e.g., boron (P+)). It is appreciated that the semiconductor substrate 302 will substantially form a drain region of the trench MOSFET upon completion of the fabrication process.

At 204, a semiconductor layer 304 is epitaxial deposited upon the substrate 302. In one implementation, the epitaxial layer may be silicon lightly doped with the first type of impurity (e.g., boron (P−)). The epitaxial deposited silicon 304 may be doped by introducing the desired impurity into the reaction chamber. At 206, the upper portion of the epitaxial layer 304 is doped with a second type of impurity (e.g., phosphorous (N)). It is appreciated that the upper portion of the epitaxial layer 304 will substantially form a body region and the lower portion will substantially form a drift region of the trench MOSFET upon completion of the fabrication process.

At 208, a photo-resist is deposited and patterned by any-well know lithography process to form a gate trench mask 308. At 210, the exposed portions of the epitaxial layer are etched by any-well known isotropic etching method to form a plurality of gate trenches 310. In one implementation, an ionic etchant interacts with the epitaxial layer exposed by the patterned resist layer. The gate trenches extend through the upper portion 306 and partially into lower portion 307 of the epitaxial layer 304. In one implementation, a plurality of substantially parallel trenches are formed. In another implementation, a plurality of trenches are formed such that a first set of trenches are substantially parallel to each other and a second set of trenches are substantially normal-to-parallel with respect to the first set of trenches.

Figure 3B:
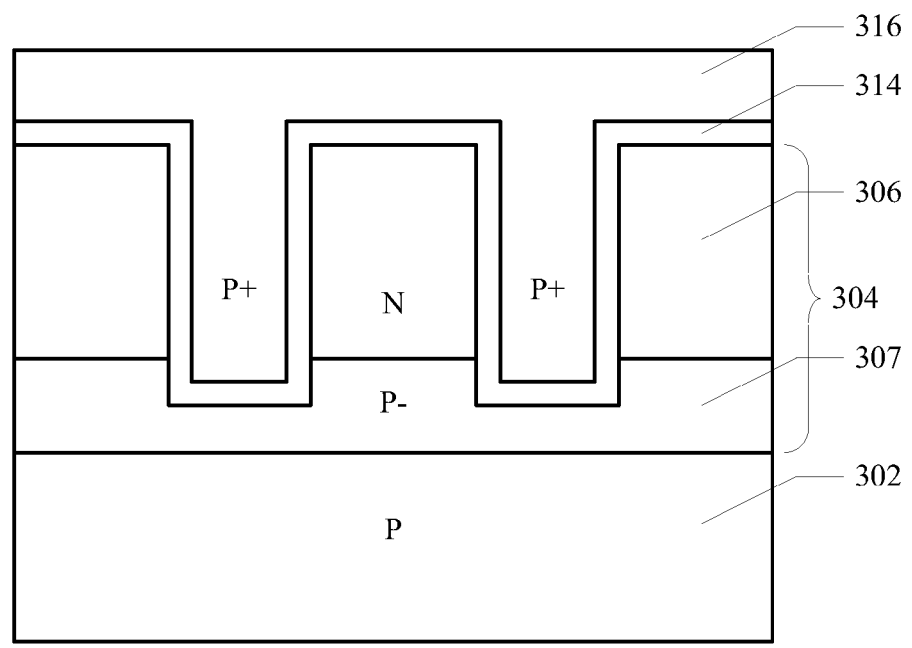
Figure 3C:
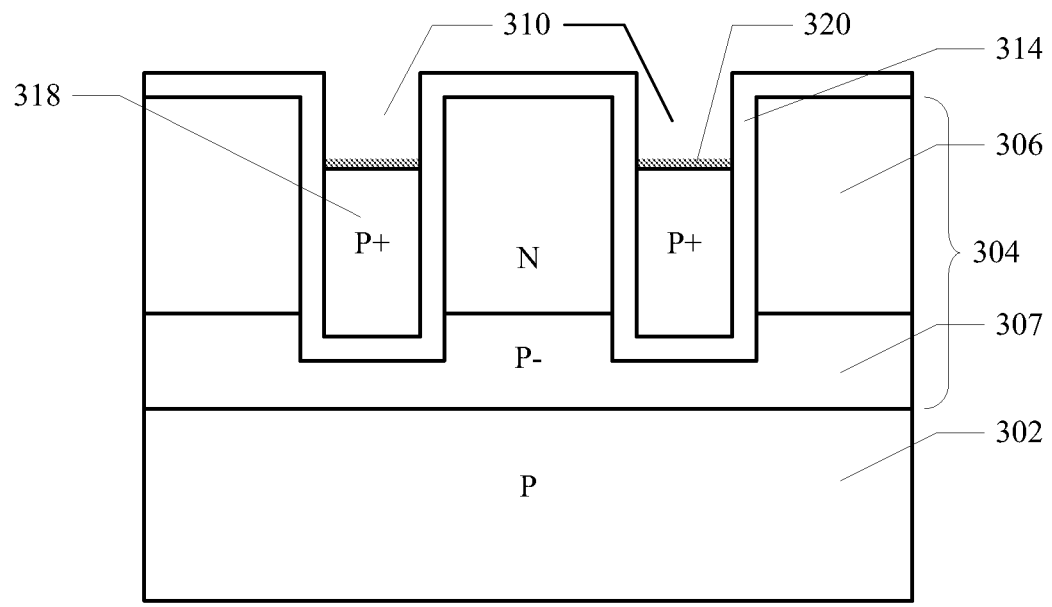

Referring now to FIG. 3B, the gate trench mask 308 is removed utilizing an appropriate resist stripper or a resist ashing process, at 212. At 214, a dielectric layer 314 is formed. In one implementation, the dielectric is formed by oxidizing the surface of the silicon to form a silicon dioxide layer. The resulting dielectric layer 314 along the gate trench walls forms a gate region dielectric 314. At 216, a polysilicon layer is deposited. The polysilicon is doped with the first type of impurity (e.g., boron (P+)). In one implementation, the polysilicon is deposited by a method such as decomposition of silane (SiH$_4$). The polysilicon may be doped by introducing the impurity during the deposition process. Referring now to FIG. 3C, excess polysilicon is removed, at 218. The polysilicon may be etched to form gate regions 318 that are partially recessed in the gate trenches 310. At 320, a metal layer 320 may be deposited on the gate regions 318. In one implementation, a metal may be deposited and a thermal anneal may be utilized to form a silicide between the metal and the polysilicon.

Figure 3D:
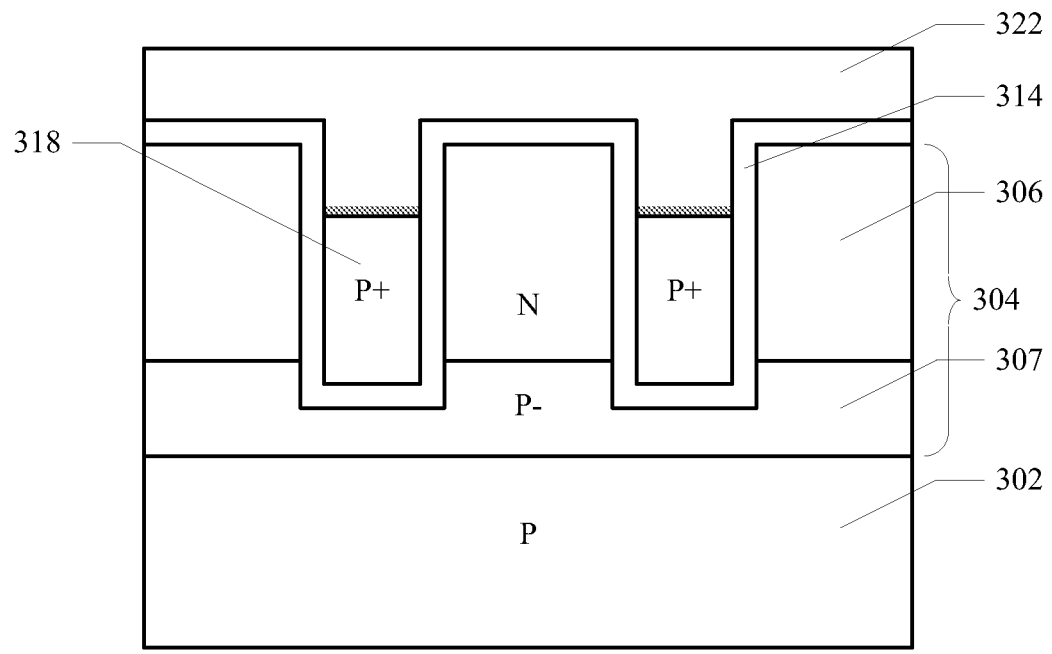
Figure 3E:
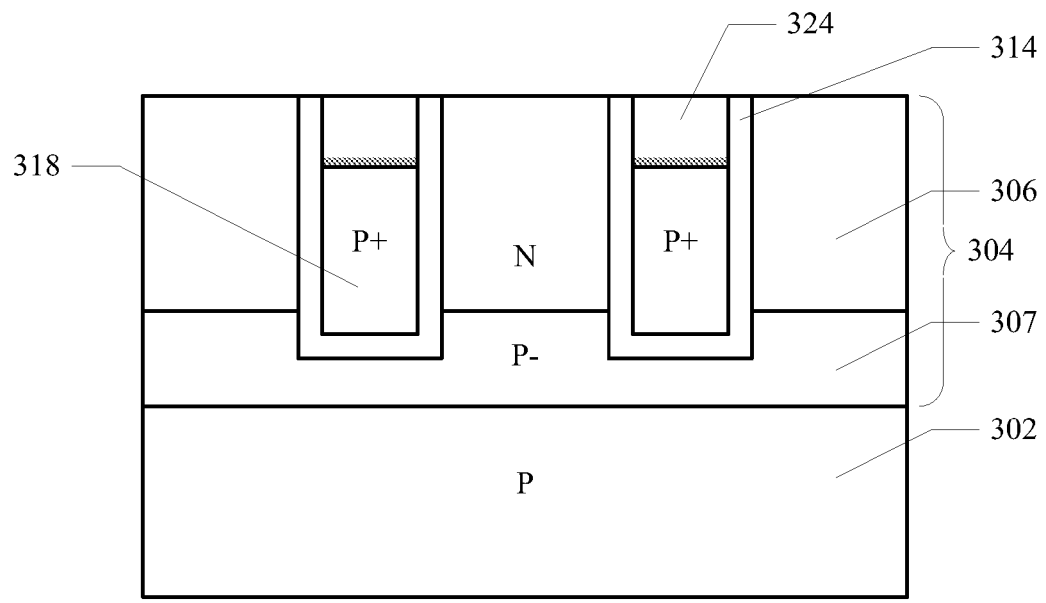

Referring now to FIG. 3D, a second dielectric layer 322 is deposited, at 222. In one implementation, the second dielectric 322 may be an oxide. Referring now to FIG. 3E, excess dielectric is removed until the surface of the epitaxial layer 304 is exposed, at 224. The portion of the second dielectric layer remaining in the recesses above the gate regions 318 forms a field dielectric 324 above the recessed gate regions 318. In one implementation, the excess dielectric layer is removed by chemical-mechanical polishing (CMP). The second dielectric layer and the first dielectric layer are removed until the epitaxial layer 304 between the gate trenches are exposed.

Figure 3F:
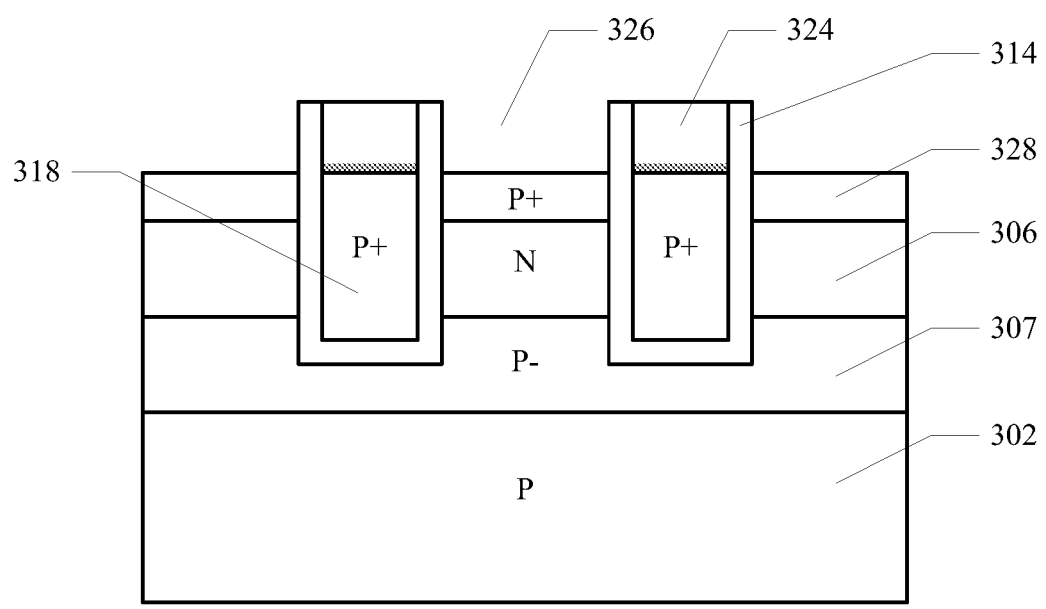

Referring now to FIG. 3F, the exposed portions of the epitaxial layer 304 are etched by any-well known isotropic etching method, at 226. The etching results in a plurality recessed semiconductor mesas 326. Those skilled in the art appreciate that the etching of recessed mesas 326 is a first self-aligned process that utilizes the field dielectric 324 and gate oxide 314 along the walls of the gate trenches 310 as a mask for the self-aligned etch. At 228, the upper portion of the body region 306 is heavily doped with the second type of impurity (e.g., boron (P+)). It is appreciated that the heavily doped portion will substantially form the source regions 328 of the trench MOSFET device.

Figure 3G:
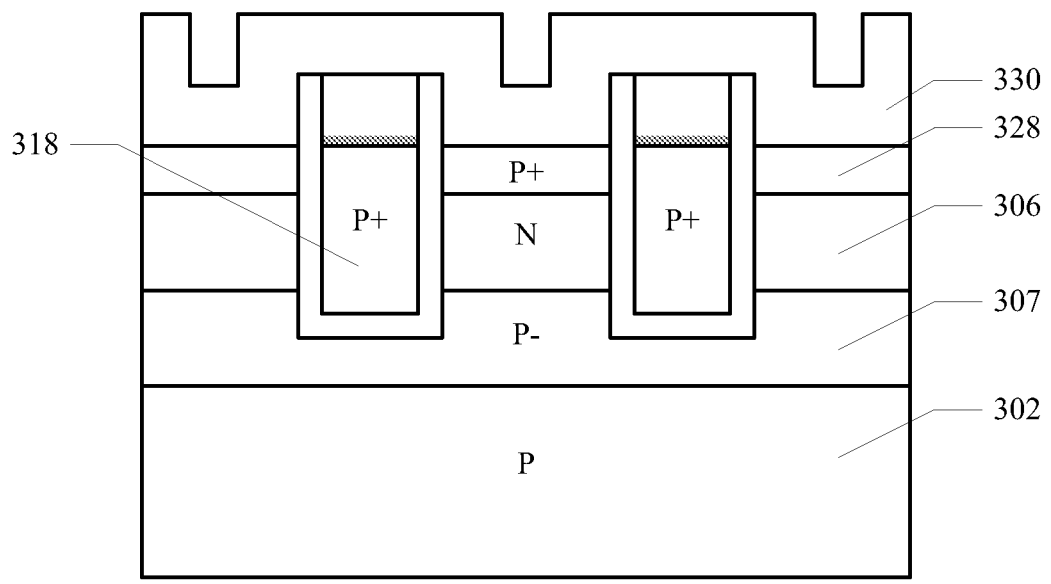
Figure 3H:
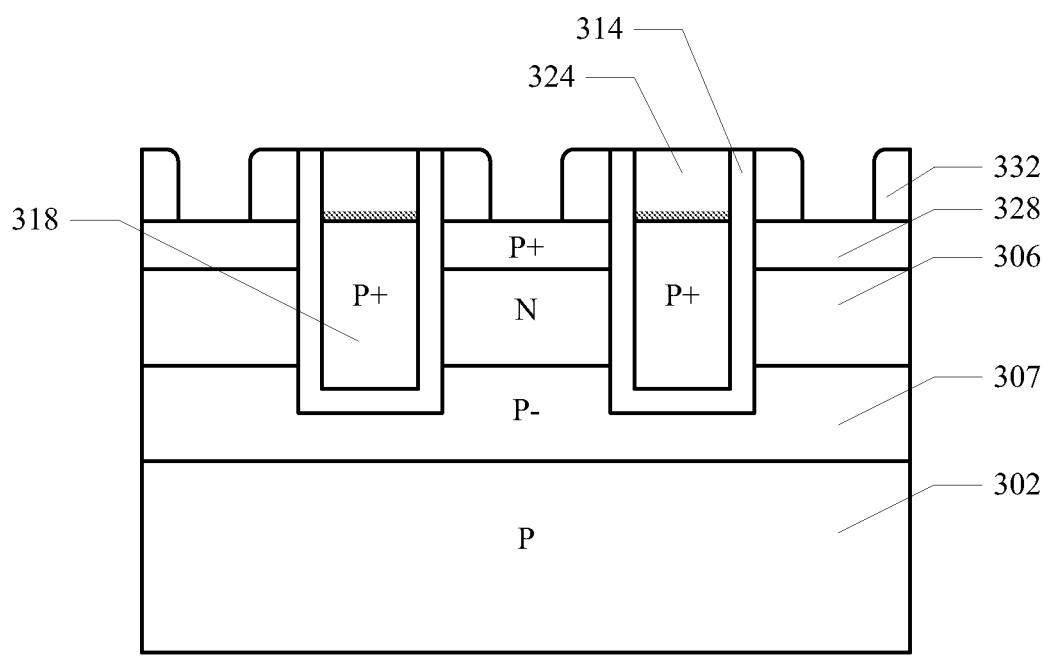

Referring now to FIG. 3G, a third dielectric layer 330 is conformally deposited, at 230. The third dielectric 330 may be an oxide, a nitride or the like. Referring now to FIG. 3H, the third dielectric layer 330 is isotropically etched, at 232. Those skilled in the art appreciate that the isotropic etch of the third dielectric layer 330 will remove the third dielectric layer 330 except for where it was conformally deposited along the vertical sides of the field dielectric/gate oxide 324, 314 thereby forming spacers 332 in the recessed mesas 326 adjacent the field dielectric/gate oxide 324, 314.

Figure 3I:
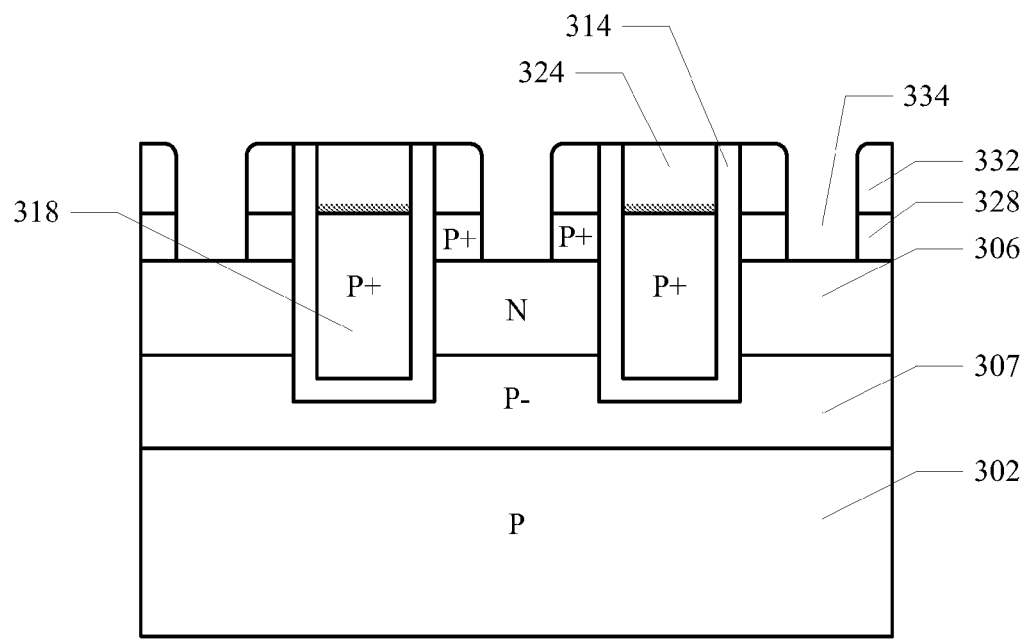

Referring now to FIG. 3I, the exposed portions of the source regions 328 are etched by any well-known anisotropic etching method, at 234. The etching process is performed until a second plurality of trenches, referred to as source/body contact trenches 334, extend through the source regions 328 to the body regions 306. Those skilled in the art appreciate that the etching of the second plurality of trenches 334 is a second self-aligned process that utilizes the combination of the field dielectric 324, gate oxide 314 and spacers 332 as a mask for the self-aligned etch. In the first implementation, the etching process forms a second plurality of substantially parallel trenches 334 disposed between the striped cell gate regions 318. In the other implementation, the etching process forms a plurality of substantially rectangular trenches disposed in the cells formed by the closed cell gate regions.

Figure 3J:
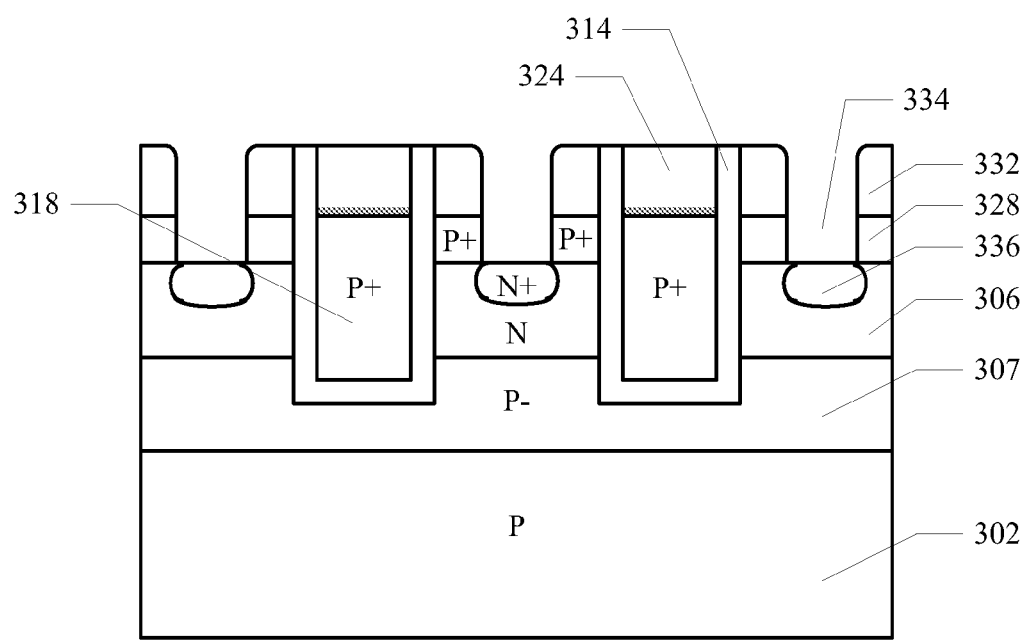

Referring now to FIG. 3J, the exposed portions of the body regions 306 are heavily doped with the second type of impurity (e.g., phosphorous (N+)) to form body contact implant regions 336, at 236. Those skilled in the art appreciate that the implanting of the body contact implant regions 336 is a third self-aligned process that utilizes the combination of the field dielectric 324, gate oxide 314 and spacers 332 as a mask for the self-aligned implant. A thermal cycle may be utilized to drive in the body contact implant regions 336.

Figure 3K:
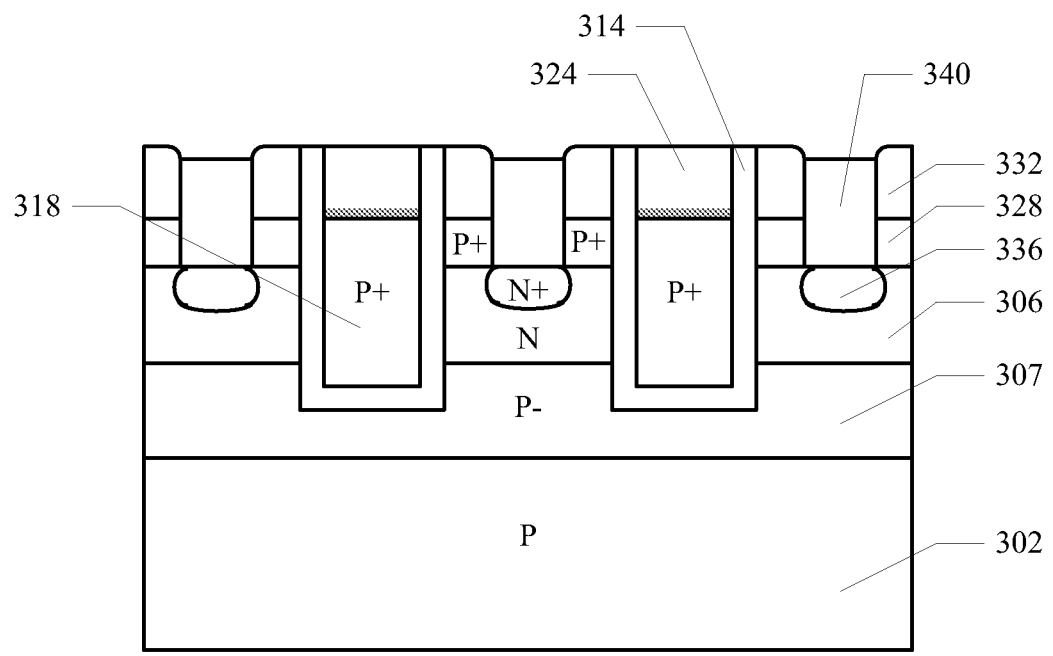

Referring now to FIG. 3K, a second metal layer is deposited in the source/body contact trenches 334, at 238. In one implementation, the metal may be titanium (Ti), titanium nitrate (TiN), tungsten (W), or a multilayer metal such as Ti/TiN/W. At 240, excess metal of the second metal layer is removed to form source/body contact plugs 340 in the source/body contact trenches 334. In one implementation, the second metal layer is chemical-mechanical polished (CMP) to form the source/body contact plugs 340.

Figure 3L:
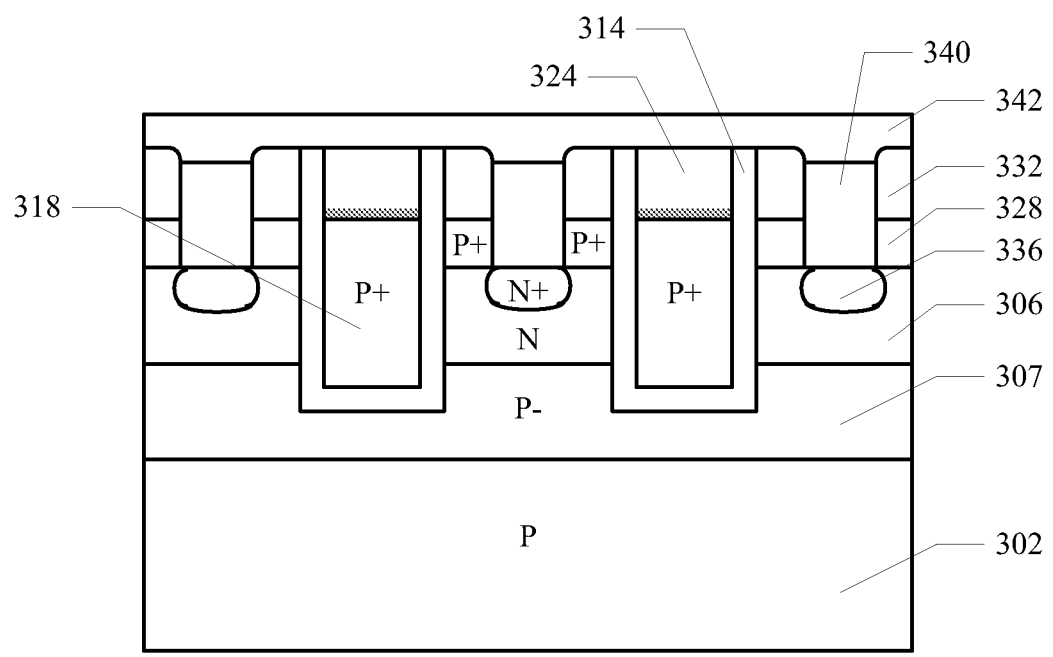
Figure 3M:
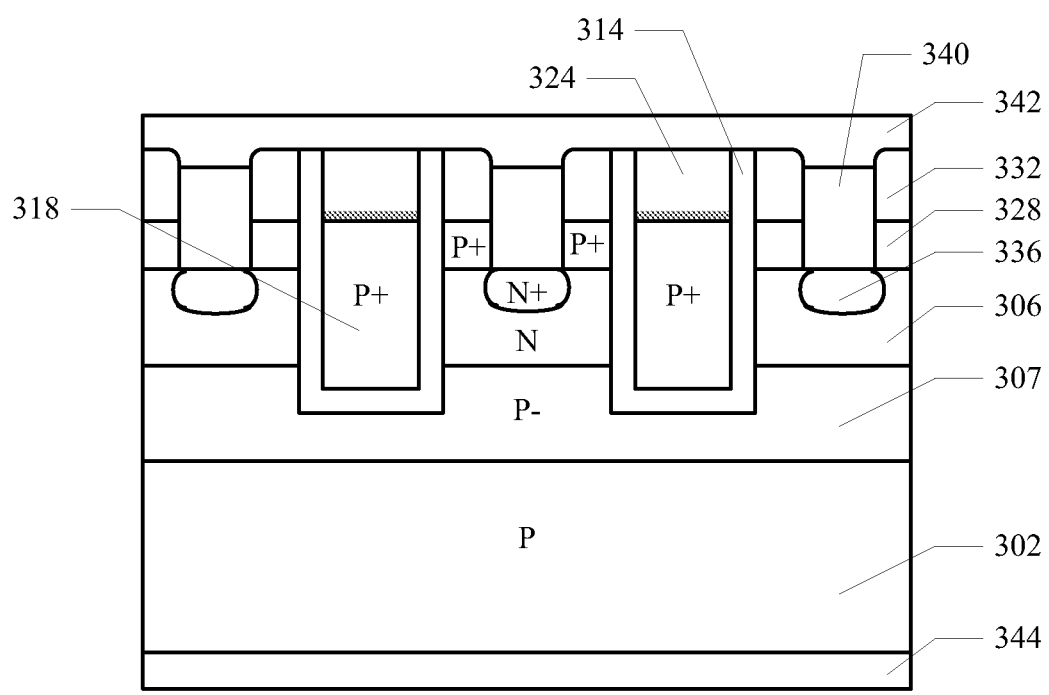

Referring now to FIG. 3L, a third metal layer 342 is deposited, at 242. In one implementation, the metal may be copper (Cu), aluminum (Al) or the like. The third metal layer 342 substantially forms the source/body contact of the trench MOSFET device. Referring now to FIG. 3M, a fourth metal layer 344 is deposited on the backside of the trench MOSFET device, at 244. In one implementation, the metal may be copper (Cu), aluminum (Al) or the like. The fourth metal layer 344 substantially forms the drain contact of the trench MOSFET device. At 246, fabrication continues with various other processes. The various processes typically include etching, depositing, doping, cleaning, annealing, passivation, cleaving and/or the like.

In one implementation, the first type of impurity may be an n-type impurity such as phosphorous and the second type of impurity may be a p-type impurity such as arsenic or boron to form an n-channel MOSFET (N-MOSFET), as illustrated in FIG. 1. In another implementation, the first type of impurity may be a p-type impurity and the second type of impurity may be an n-type impurity to form a p-channel MOSFET (P–MOSFET), as illustrated in FIG. 3M.

Figure 4:
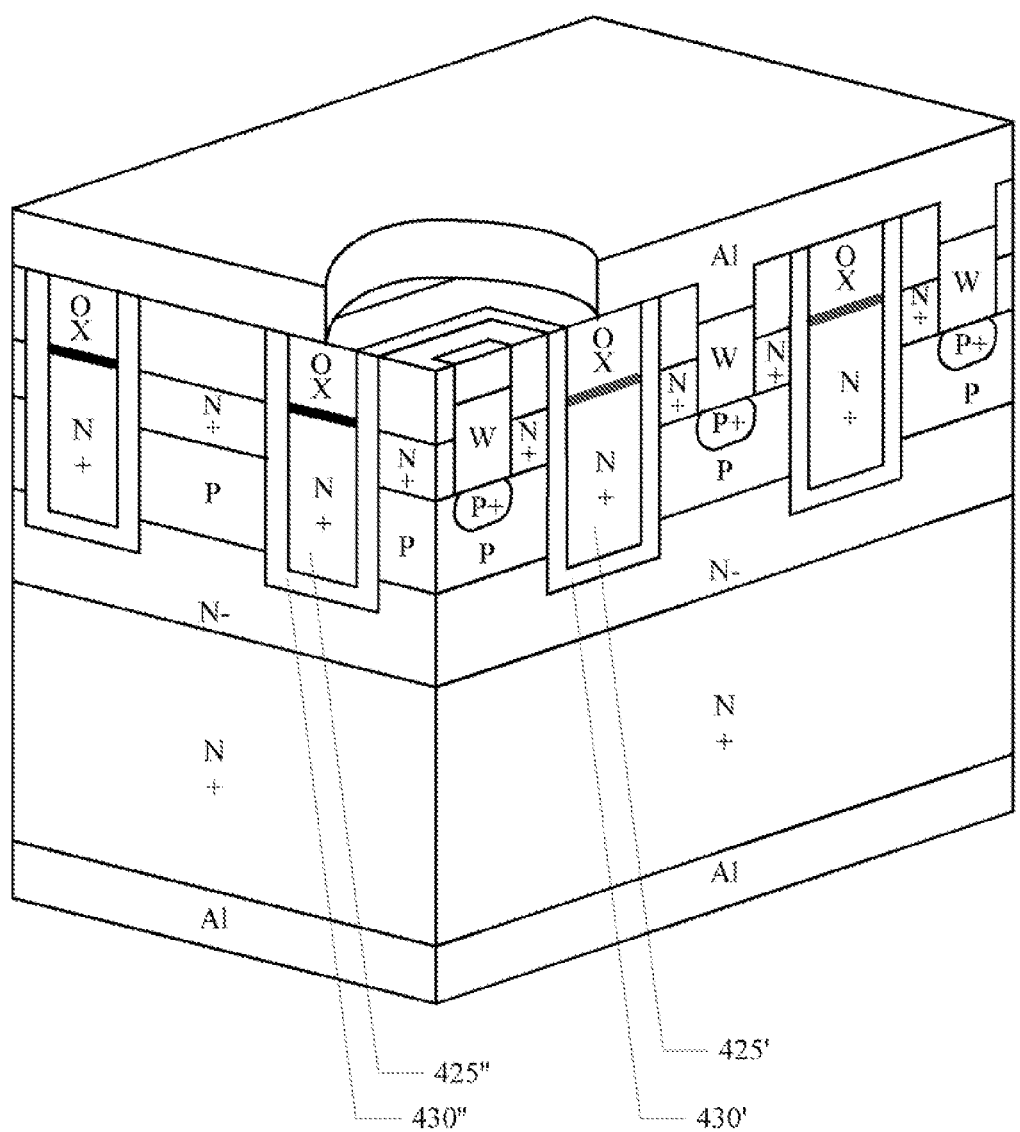
FIG. 4 shows a cross section perspective view of a trench MOSFET, in accordance with another embodiment of the present technology.

Referring now to FIG. 4, a cross sectional perspective view of a trench metal-oxide-semiconductor field effect transistor (MOSFET) 400, in accordance with another embodiment of the present technology, is shown. The structure and operation of trench MOSFET 400 is substantially the same as described above with reference to FIG. 1. FIG. 4, however, illustrates a closed cell structure according to one implementation. The gate region and the gate insulator region may include a first portion formed as a first plurality of substantially parallel elongated structures 425', 430' and a second portion is formed as a second plurality of substantially elongated structures 425", 430" that are substantially perpendicular to the first plurality of substantially parallel elongated structures 425', 430'.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A trench metal-oxide-semiconductor field effect transistor (MOSFET) comprising:

a drain region;

a plurality of gate regions disposed in a plurality of trenches above the drain region;

a plurality of gate insulator regions, wherein each of the plurality of gate insulator regions are disposed about a periphery of a respective one of the plurality of gate regions;

a plurality of field insulator regions, wherein each of the plurality of field insulator regions are disposed in a respective one of the plurality of trenches above a respective one of the plurality of gate regions;

a plurality of source regions disposed in recessed mesas between the plurality of gate insulator regions, wherein the recessed mesas are aligned to the plurality of field insulator regions disposed in the plurality of trenches;

a plurality of body regions disposed in the recessed mesas between the plurality of gate insulator regions and between the plurality of source regions and the drain region;

a plurality of body contact regions disposed in each body region adjacent the plurality of source regions;

a plurality of source/body contact spacers disposed between the plurality of gate insulator regions above the recessed mesas, wherein the plurality of body contact regions are aligned to the plurality of source body contact spacers; and a plurality of source/body contact plugs disposed between the source/body contact spacers and coupling the plurality of body contact regions to the plurality of source regions.

2. The trench metal-oxide-semiconductor field effect transistor (MOSFET) of claim 1, wherein the gate region is formed as a plurality of substantially parallel elongated structures.

3. The trench metal-oxide-semiconductor field effect transistor (MOSFET) of claim 1, wherein:

a first portion of the gate region is formed as a first plurality of substantially parallel elongated structures; and a second portion of the gate region is formed as a second plurality of substantially parallel elongated structures that are substantially perpendicular to the first plurality of substantially parallel elongated structures.

4. The trench metal-oxide-semiconductor field effect transistor (MOSFET) of claim 1, wherein:

the drain region comprises an n-doped semiconductor;

the gate region comprises a n-doped semiconductor;

the gate insulator region comprises an oxide;

the plurality of source regions comprise a heavily n-doped semiconductor;

the body region comprises a p-doped semiconductor;

the plurality of body contact regions comprise a heavily p-doped semiconductor;

the plurality of source/body contact spacers comprise an oxide;

the source/body contact comprise a first metal; and the plurality of source/body contact plugs comprise a second metal.

5. The trench metal-oxide-semiconductor field effect transistor (MOSFET) of claim 1, wherein:

the first metal comprises aluminum; and the second metal comprises tungsten.

6. The trench metal-oxide-semiconductor field effect transistor (MOSFET) of claim 1, further comprising a drift region disposed between the drain region and the body region.

7. The trench metal-oxide-semiconductor field effect transistor (MOSFET) of claim 6, wherein:

the drain region comprises a heavily n-doped semiconductor; and the drift region comprises a lightly n-doped semiconductor.

* * * * *